(12) United States Patent
Yang et al.

(10) Patent No.: US 7,709,317 B2
(45) Date of Patent: May 4, 2010

(54) METHOD TO INCREASE STRAIN ENHANCEMENT WITH SPACERLESS FET AND DUAL LINER PROCESS

(75) Inventors: Haining S. Yang, Wappingers Falls, NY (US); Siddhartha Panda, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 931 days.

(21) Appl. No.: 11/164,193

(22) Filed: Nov. 14, 2005

(65) Prior Publication Data
US 2007/0108525 A1    May 17, 2007

(51) Int. Cl.
*H01L 27/12* (2006.01)
*H01L 21/84* (2006.01)

(52) U.S. Cl. .................. 438/219; 438/153; 257/351; 257/369; 257/374; 257/E29.193

(58) Field of Classification Search .................. 257/374, 257/369, 351; 438/219, 153
See application file for complete search history.

(56) References Cited

U.S. PATENT DOCUMENTS

| | | | |
|---|---|---|---|
| 3,602,841 A | 8/1971 | McGroddy | |
| 4,665,415 A | 5/1987 | Esaki et al. | |
| 4,853,076 A | 8/1989 | Tsaur et al. | |
| 4,855,245 A | 8/1989 | Neppl et al. | |
| 4,952,524 A | 8/1990 | Lee et al. | |
| 4,958,213 A | 9/1990 | Eklund et al. | |
| 5,006,913 A | 4/1991 | Sugahara et al. | |
| 5,060,030 A | 10/1991 | Hoke et al. | |
| 5,081,513 A | 1/1992 | Jackson et al. | |
| 5,108,843 A | 4/1992 | Ohtaka et al. | |
| 5,134,085 A | 7/1992 | Gilgen et al. | |
| 5,310,446 A | 5/1994 | Konishi et al. | |
| 5,354,695 A | 10/1994 | Leedy | |

(Continued)

FOREIGN PATENT DOCUMENTS

JP    64-76755    3/1989

OTHER PUBLICATIONS

Kern Rim, et al., "Transconductance Enhancement In Deep Submicron Strained-Si n-MOSFETs", International Electron Devices Meeting, 26, 8, 1, IEEE, Sep. 1998.
Kern Rim, et al., "Characteristics and Device Design of Sub-100 nm Strained Si N- and PMOSFETs." 2002 Symposium on VLSI Technology Digest of Technical Papers, IEEE, pp. 98-99.

(Continued)

*Primary Examiner*—Matthew Smith
*Assistant Examiner*—Walter H Swanson
(74) *Attorney, Agent, or Firm*—Scully, Scott, Murphy & Presser, P.C.; H. Daniel Schnurmann (57) ABSTRACT

A semiconductor structure and a method of fabricating the same in which strain enhancement is achieved for both nFET and pFET devices is provided. In particular, the present invention provides at least one spacerless FET for stronger strain enhancement and defect reduction. The at least one spacerless FET can be a pFET, an nFET, or a combination thereof, with spacerless pFETs being particularly preferred since pFETs are generally fabricated to have a greater width than nFETs. The at least one spacerless FET allows to provide a stress inducing liner in closer proximity to the device channel than prior art structures including FETs having spacers. The spacerless FET is achieved without negatively affecting the resistance of the corresponding silicided source/drain diffusion contacts, which do not encroach underneath the spacerless FET.

12 Claims, 5 Drawing Sheets

U.S. PATENT DOCUMENTS

| | | | |
|---|---|---|---|
| 5,371,399 | A | 12/1994 | Burroughes et al. |
| 5,391,510 | A | 2/1995 | Hsu et al. |
| 5,459,346 | A | 10/1995 | Asakawa et al. |
| 5,471,948 | A | 12/1995 | Burroughes et al. |
| 5,557,122 | A | 9/1996 | Shrivastava et al. |
| 5,561,302 | A | 10/1996 | Candelaria |
| 5,565,697 | A | 10/1996 | Asakawa et al. |
| 5,571,741 | A | 11/1996 | Leedy |
| 5,592,007 | A | 1/1997 | Leedy |
| 5,592,018 | A | 1/1997 | Leedy |
| 5,670,798 | A | 9/1997 | Schetzina |
| 5,679,965 | A | 10/1997 | Schetzina |
| 5,683,934 | A | 11/1997 | Candelaria |
| 5,840,593 | A | 11/1998 | Leedy |
| 5,861,651 | A | 1/1999 | Brasen et al. |
| 5,880,040 | A | 3/1999 | Sun et al. |
| 5,940,716 | A | 8/1999 | Jin et al. |
| 5,940,736 | A | 8/1999 | Brady et al. |
| 5,946,559 | A | 8/1999 | Leedy |
| 5,960,297 | A | 9/1999 | Saki |
| 5,989,978 | A | 11/1999 | Peidous |
| 6,008,126 | A | 12/1999 | Leedy |
| 6,025,280 | A | 2/2000 | Brady et al. |
| 6,046,464 | A | 4/2000 | Schetzina |
| 6,066,545 | A | 5/2000 | Doshi et al. |
| 6,090,684 | A | 7/2000 | Ishitsuka et al. |
| 6,107,143 | A | 8/2000 | Park et al. |
| 6,117,722 | A | 9/2000 | Wuu et al. |
| 6,133,071 | A | 10/2000 | Nagai |
| 6,165,383 | A | 12/2000 | Chou |
| 6,221,735 | B1 | 4/2001 | Manley et al. |
| 6,228,694 | B1 | 5/2001 | Doyle et al. |
| 6,246,095 | B1 | 6/2001 | Brady et al. |
| 6,255,169 | B1 | 7/2001 | Li et al. |
| 6,261,964 | B1 | 7/2001 | Wu et al. |
| 6,265,317 | B1 | 7/2001 | Chiu et al. |
| 6,274,444 | B1 | 8/2001 | Wang |
| 6,281,532 | B1 | 8/2001 | Doyle et al. |
| 6,284,623 | B1 | 9/2001 | Zhang et al. |
| 6,284,626 | B1 | 9/2001 | Kim |
| 6,319,794 | B1 | 11/2001 | Akatsu et al. |
| 6,361,885 | B1 | 3/2002 | Chou |
| 6,362,082 | B1 | 3/2002 | Doyle et al. |
| 6,368,931 | B1 | 4/2002 | Kuhn et al. |
| 6,403,486 | B1 | 6/2002 | Lou |
| 6,403,975 | B1 | 6/2002 | Brunner et al. |
| 6,406,973 | B1 | 6/2002 | Lee |
| 6,461,936 | B1 | 10/2002 | von Ehrenwall |
| 6,476,462 | B2 | 11/2002 | Shimizu et al. |
| 6,483,171 | B1 | 11/2002 | Forbes et al. |
| 6,493,497 | B1 | 12/2002 | Ramdani et al. |
| 6,498,358 | B1 | 12/2002 | Lach et al. |
| 6,501,121 | B1 | 12/2002 | Yu et al. |
| 6,506,652 | B2 | 1/2003 | Jan et al. |
| 6,509,618 | B2 | 1/2003 | Jan et al. |
| 6,521,964 | B1 | 2/2003 | Jan et al. |
| 6,531,369 | B1 | 3/2003 | Ozkan et al. |
| 6,531,740 | B2 | 3/2003 | Bosco et al. |
| 6,621,392 | B1 | 9/2003 | Volant et al. |
| 6,635,506 | B2 | 10/2003 | Volant et al. |
| 6,717,216 | B1 | 4/2004 | Doris et al. |
| 6,831,292 | B2 | 12/2004 | Currie et al. |
| 7,429,775 | B1 * | 9/2008 | Nayak et al. ................. 257/369 |
| 2001/0009784 | A1 | 7/2001 | Ma et al. |
| 2002/0063292 | A1 | 5/2002 | Armstrong et al. |
| 2002/0074598 | A1 | 6/2002 | Doyle et al. |
| 2002/0086472 | A1 | 7/2002 | Roberds et al. |
| 2002/0086497 | A1 | 7/2002 | Kwok |
| 2002/0090791 | A1 | 7/2002 | Doyle et al. |
| 2003/0032261 | A1 | 2/2003 | Yeh et al. |
| 2003/0040158 | A1 | 2/2003 | Saitoh |
| 2003/0057184 | A1 | 3/2003 | Yu et al. |
| 2003/0067035 | A1 | 4/2003 | Tews et al. |
| 2003/0181005 | A1 * | 9/2003 | Hachimine et al. .......... 438/231 |
| 2004/0262784 | A1 | 12/2004 | Doris et al. |
| 2005/0247926 | A1 | 11/2005 | Sun et al. |
| 2007/0034963 | A1 * | 2/2007 | Sudo .......................... 257/369 |
| 2009/0026549 | A1 * | 1/2009 | Teh et al. .................... 257/369 |

OTHER PUBLICATIONS

Gregory Scott, et al., "NMOS Drive Current Reduction Caused by Transistor Layout and Trench Isolation Induced Stress." International Electron Devices Meeting, 34.4.1, IEEE, Sep. 1999.

F. Ootsuka, et al., "A Highly Dense, High-Performance 130nm Node CMOS Technology for Large Scale System-on-a-Chip Application." International Electron Devices Meeting, 23.5.1, IEEE, Apr. 2000.

Shinya Ito, et al., "Mechanical Stress Effect of Etch-Stop Nitride and its Impact on Deep Submicron Transistor Design." International Electron Devices Meeting, 10.7.1, IEEE, Apr. 2000.

A. Shimizu, et al., "Local Mechanical-Stress Control (LMC): A New Technique for CMOS-Performance Enhancement." International Electron Devices Meeting, IEEE, Mar. 2001.

K. Ota, et al., "Novel Locally Strained Channel Technique for High Performance 55nm CMOS." International Electron Devices Meeting, 2.2.1, IEEE, Feb. 2002.

G. Zhang, et al., "A New 'Mixed-Mode' Reliability Degradation Mechanism in Advanced Si and SiGe Bipolar Transistors," IEEE Transactions on Electron Devices, vol. 49, No. 12, Dec. 2002, pp. 2151-2156.

H.S. Momose, et al., "Temperature Dependence of Emitter-Base Reverse Stress Degradation and Its Mechanism Analyzed by MOS Structures." Paper 6.2, pp. 140-143.

C.J. Huang, et al., "Temperature Dependence and Post-Stress Recovery of Hot Electron Degradation Effects in Bipolar Transistors." IEEE 1991 Bipolar Circuits and Technology Meeting 7.5, pp. 170-173.

S.R. Sheng, et al., "Degradation and Recovery of SiGe HBTs Following Radiation and Hot-Carrier Stressing." pp. 14-15.

Z. Yang, et al., "Avalanche Current Induced Hot Carrier Degradation in 200 GHz SiGe Heterojunction Bipolar Transistors." pp. 1-5.

H. Li, et al., "Design of W-Band VCOs with High Output Power for Potential Application in 77 GHz Automotive Radar Systems." 2003 IEEE GaAs Digest, pp. 263-266.

H. Wurzer, et al., "Annealing of Degraded npn-Transistors- Mechanisms and Modeling." IEEE Transactions on Electron Devices, vol. 41, No. 4, Apr. 1994, pp. 533-538.

B. Doyle, et al., "Recovery of Hot-Carrier Damage in Reoxidized Nitrided Oxide MOSFETs." IEEE Electron Device Letters, vol. 13, No. 1, Jan. 1992, pp. 38-40.

H.S. Momose, et al., "Analysis of the Temperature Dependence of Hot-Carrier-Induced Degradation in Bipolar Transistors for Bi-CMOS." IEEE Transactions on Electron Devices, vol. 41, No. 6, Jun. 1994, pp. 978-987.

M. Khater, et al., "SiGe HBT Technology with Fnax/Ft = 350/300 GHz and Gate Delay Below 3.3 ps". 2004 IEEE, 4 pages.

J.C. Bean, et al., "GEx SI 1-x/Si Strained-Layer Superlattice Grown by Molecular Beam Epitaxy". J. Vac. Sci. Technol. A 2 (2), Apr.-Jun. 1984, pp. 436-440.

J.H. Van Der Merwe, "Regular Articles". Journal of Applied Physics, vol. 34, No. 1, Jan. 1963, pp. 117-122.

J.W. Matthews, et al., "Defects in Epitaxial Multilayers". Journal of Crystal Growth 27 (1974), pp. 118-125.

Subramanian S. Iyer, et al., "Heterojunction Bipolar Transistors Using Si-Ge Alloys". IEEE Transactions on Electron Devices, vol. 36, No. 10, Oct. 1989, pp. 2043-2064.

R.H.M. Van De Leur, et al., "Critical Thickness for Pseudomorphic Growth of Si/Ge Alloys and Superlattices". J. Appl. Phys. 64 (6), Sep. 15, 1988, pp. 3043-3050.

D.C. Houghton, et al., "Equilibrium Critical Thickness for SI 1-x GEx Strained Layers on (100) Si". Appl. Phys. Lett. 56 (5), Jan. 29, 1990, pp. 460-462.

EP Official Action—Application No. 06 793 886.0—1235, dated Jun. 18, 2009.

* cited by examiner

METHOD TO INCREASE STRAIN ENHANCEMENT WITH SPACERLESS FET AND DUAL LINER PROCESS

FIELD OF THE INVENTION

The present invention relates to a semiconductor structure and a method of fabricating such a structure. More particularly, the present invention relates to a semiconductor structure with increased strain enhancement that is achieved with a spacerless FET and a stress inducing liner. The present invention also provides a method of fabricating such a semiconductor structure in which a spacerless FET and a dual liner process are employed to provide a semiconductor structure with increased strain enhancement.

BACKGROUND OF THE INVENTION

In present semiconductor technology, complementary metal oxide semiconductor (CMOS) devices, such as nFETs or pFETs, are typically fabricated upon semiconductor wafers, such as Si, that have a single crystal orientation. In particular, most of today's semiconductor devices are built upon Si having a (100) crystal orientation.

Electrons are known to have a high mobility for a (100) Si surface orientation, but holes are known to have a high mobility for a (110) surface orientation. That is, hole mobility values on (100) Si are roughly 2x-4x lower than the corresponding electron mobility for this crystallographic orientation. To compensate for this discrepancy, pFETs are typically designed with larger widths in order to balance pull-up currents against the nFET pull-down currents and achieve uniform circuit switching.

On the other hand, hole mobility on (110) Si is 2x higher than on (100) Si; therefore, pFETs formed on a (110) surface will exhibit significantly higher drive currents than pFETs formed on a (100) surface. Unfortunately, electron mobility on (110) Si surfaces is significantly degraded compared to (100) Si surfaces.

As can be deduced from the above, the (110) Si surface is optimal for pFET devices because of excellent hole mobility, yet such a crystal orientation is completely inappropriate for nFET devices. Instead, the (100) Si surface is optimal for nFET devices since that crystal orientation favors electron mobility.

Hybrid oriented substrates having planar surfaces with different crystallographic orientation have recently been developed. See, for example, U.S. patent application Ser. No. 10/250,241, filed Jun. 23, 2003 and U.S. patent application Ser. No. 10/696,634, filed Oct. 29, 2003. Additionally, hybrid-orientated metal oxide semiconductor field effect transistors (MOSFETs) have recently demonstrated significantly higher circuit performance at the 90 nm technology node. As discussed above, the electron mobility and hole mobility can be optimized independently by placing the nFET on a (100) surface and the pFET on a (110) surface.

Although hybrid oriented substrates having planar surfaces of different crystal orientation can increase the carrier mobility, further improvement is needed in order to keep the performance scaling as devices are being scaled.

Another means to enhance carrier mobility is to introduce a stress into the channel of the MOSFET. Stress can be introduced into a single crystal oriented substrate by several methods including, for example, forming a stress inducing liner on top of the substrate and around the gate region. In current technologies within the 90 nm mode, strain enhancement for nFETs and pFETs is achieved using a dual nitride liner process. In such a process, a nitride liner of tensile stress is formed about the nFET and a nitride liner of compressive stress is formed about the pFET.

In addition to using two different types of stressed liners to achieve stressed channels in both the pFET and nFET devices, the pFET spacer is typically much wider than the nFET spacer to achieve optimum device parameters, such as, for example, resistance and threshold voltage roll off. When wider pFET spacers are used, the distance of the compressive nitride film to the pFET channel is increased and, as such, there is a diminished strain enhancement on the pFET device. In addition, wider spacers reduce the space between two closely placed pFET devices causing oxide voids in the interconnect dielectric (ILD) that is formed atop the pFET. The ILD voids are later filled with metal during metal contact formation forming metal stringers which may shorten the contacts.

In view of the above, there is still a need for providing a semiconductor structure in which strain enhancement is achieved for both nFET and pFET devices in which the problems of using wider spacers for the pFET device is eliminated.

SUMMARY OF THE INVENTION

The present invention provides a semiconductor structure and a method of fabricating the same in which strain enhancement is achieved for both nFET and pFET devices. In particular, the present invention provides at least one spacerless FET for stronger strain enhancement and defect reduction. The at least one spacerless FET can be a pFET, an nFET, or a combination thereof, with spacerless pFETs being particularly preferred since pFETs are generally fabricated to have a greater width than nFETs.

By "spacerless" it is meant that the wide outer spacer typically used in forming the source/drain diffusion regions is completely eliminated or replaced with a much narrower spacer. The term "wide spacer" denotes a spacer have a width along a bottom portion, which forms an interface with the underlying layer, i.e., substrate or gate dielectric, of about 20 nm or greater.

In accordance with the present invention, a semiconductor structure is provided in which the stress inducing liner is located in a greater proximity (on the order of about 30 nm or less) to the device channel by completely removing the wide outer spacer or by significantly reducing the width of such a spacer. As such, a stronger strain enhancement is achieved which provides improved device speed. The present invention achieves the strain enhancement, without negatively impacting the resistance of the silicide contact that is present over the source/drain diffusion regions of the FET device. In prior art processing, the resistance of the silicide contact above the source/drain diffusion regions is affected (i.e., increased resistance) when the stress inducing liner is removed from one of the FET device regions during a dual stress liner process.

In the present invention, a recrystallizing anneal step is used to decrease the resistance of the silicide contact which was increased during the course of removing the stress inducing liner from one of the FET device regions. The increased resistance of the silicide contacts is a result of damage, in terms of amorphiziation, which is induced during the removal of the stress inducing liner from one of the FET device regions. In addition to the above, the semiconductor structure having strain enhancement is achieved, while preventing metal stringer formation between neighboring contacts in nested FET regions.

These and other advantages are achieved without requiring an additional masking step or having to re-engineer the CMOS process. As such, the present invention provides a cost efficient method for fabricating semiconductor structures that have strain enhanced FET device regions.

In broad terms, the present invention provides a semiconductor structure comprising:

at least one pFET and at least one nFET located on a surface of a semiconductor substrate and separated from each other by an isolation region, wherein at least one of said nFETs or said pFETs is a spacerless FET, each FET including a channel region;

a recrystallized silicide contact located above source/drain diffusion regions of said spacerless FET, said recrystallized silicide contact does not encroach under sidewalls of said spacerless FET; and a compressive stress inducing liner located around said at least one pFET and a tensile stress inducing liner located around said at least one nFET, wherein at least one of stress inducing liners which is around said spacerless FET is positioned within 30 nm or less from the corresponding channel region.

In a preferred embodiment, the spacerless FET is a pFET and the compressive stress inducing liner is located in proximity to the channel region of the spacerless pFET.

In addition to the semiconductor structure mentioned above, the present invention also provides a method of fabricating such a structure. In one embodiment, in which either the pFET or the nFET is made spacerless, the method of the present invention comprises: forming a first stress inducing liner and an overlaying hard mask on a structure including at least one nFET and at least one pFET, said first stress inducing liner having a first stress type and each FET including a devices channel, a wide outer spacer and a silicided source/drain diffusion contact;

selectively removing said overlaying hard mask, said first stress inducing liner, and all or part of said wide outer spacer from one of said nFETs or pFETs to form at least one spacerless FET, wherein during removal of said first stress inducing liner and said wide spacer, said silicided source/drain diffusion contact of said at least one spacerless FET is amorphized;

annealing said structure to recrystallize said amorphized silicided source/drain diffusion contact of said at least one spacerless FET; and selectively providing a second stress inducing liner of a second stress type that is different from said first stress type to said at least one spacerless FET, wherein said second stress inducing liner is positioned within 30 nm or less from the channel region of the at least one spacerless FET.

In a preferred embodiment, the at least one spacerless FET is a pFET, said first stress inducing liner is of tensile strain and said second stress inducing liner is of compressive strain.

In another embodiment, in which both the pFET and the nFET are made spacerless, the method of the present invention comprises:

forming a first stress inducing liner and an overlaying hard mask on a structure including at least one spacerless nFET and at least one spacerless pFET, said first stress inducing liner having a first stress type and each FET including a devices channel and a silicided source/drain diffusion contact;

selectively removing said overlaying hard mask and said first stress inducing liner from one of said nFETs or pFETs, wherein during removal of said first stress inducing liner from one of said FETs its corresponding silicided source/drain diffusion contact is amorphized; annealing said structure to recrystallize said amorphized silicided source/drain diffusion contact; and selectively providing a second stress inducing liner of a second stress type that is different from said first stress type to the spacerless FET in which the first stress inducing liner was previously removed, wherein said first and second stress inducing liners are positioned within 30 nm or less from the corresponding channel region of each spacerless FET.

DETAILED DESCRIPTION

The present invention, which provides a structure and method to increase strain enhancement for FET devices, will now be described in greater detail by referring to the following discussion and drawings that accompany the present application. It is noted that the drawings of the present application are provided for illustrative purposes and, as such, they are not drawn to scale.

The present invention will now be described in context with a preferred embodiment thereof in which strain enhancement is achieved using a spacerless pFET. Although a spacerless pFET is described and depicted hereinbelow, the present application also contemplates the case where a spacerless nFET is used alone or in conjunction with a spacerless pFET. When only a spacerless nFET is employed, the processing sequence is modified such that a compressive stress inducing liner is first formed, removed from the nFET region, and thereafter the wide spacer is removed from the nFET device. When spacerless nFETs and pFETs are formed, the wide spacers are removed after silicide formation and prior to forming the first stress inducing liner.

Figure 1A:
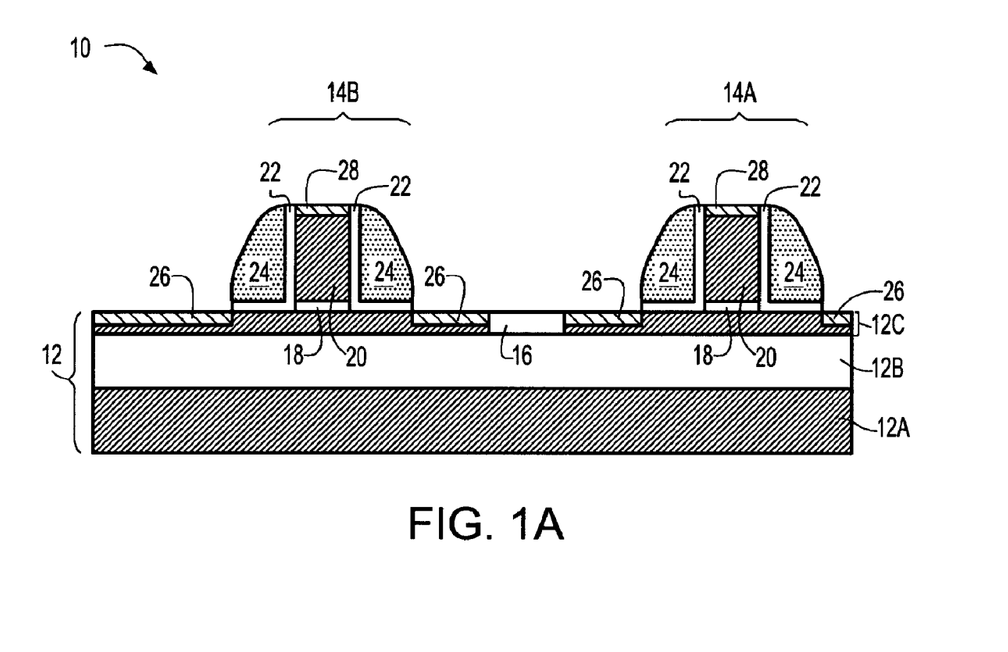
FIGS. 1A-1J are pictorial representations (through cross sectional views) depicting the basic processing steps employed in the present invention.

FIG. 1A shows an initial structure 10 that is employed in the present invention. The initial structure 10 comprises a semiconductor substrate 12 that includes at least one pFET 14A and at least one nFET 14B located on a surface of the substrate 12. The FETs of different conductivity, i.e., pFETs and nFETs, are separated from each other by an isolation region 16. Each of the FETs includes a gate dielectric 18, a gate conductor 20, optional inner spacer (or passivation layer) 22, and outer spacer 24. Silicide contacts 26 are shown in the semiconductor substrate 12 in the region in which source/drain diffusions will be present. A silicide contact 28 may optionally be located atop the gate conductors when the gate conductors are comprised of a Si-containing material.

The initial structure shown in FIG. 1A is comprised of materials that are well known in the art. Moreover, the FETs, isolation regions and silicide contacts can also be formed utilizing conventional techniques that are well known in the art. For example, the FETs can be formed by deposition of the various material layers and patterning via lithography and etching. Alternatively, a replacement gate process can be used in forming the FETs.

The semiconductor substrate 12 of the initial structure 10 may be a semiconductor-on-insulator (as shown) or a bulk semiconductor. The semiconductor substrate 12 may be strained, unstrained or contain regions of strain and unstrain therein. The semiconductor substrate 12 may have a single crystal orientation or it may be a hybrid substrate having regions of different crystal orientation. When hybrid substrates are employed, the nFETs and pFETs are fabricated in a region having a crystal orientation that will provide enhanced device performance to the specific device. For example, nFETs would be formed on a (100) surface, while the pFETs would be formed on a (110) surface.

In the specific embodiment shown, the semiconductor-on-insulator comprises an upper semiconductor layer 12C and a bottom semiconductor layer 12A that are separated entirely or in part by a buried insulating layer 12B. The upper and lower semiconductor layers may comprise the same or different semiconductor material, with the same semiconductor material being highly preferred. The buried insulating layer 12B may be a crystalline or non-crystalline oxide, nitride or oxynitride. The semiconductor-on-insulator substrate can be formed by a conventional layer transfer process or by an ion implantation and annealing process referred to as SIMOX (Separation by Ion Implantation of Oxygen).

The term "semiconductor material or layer" is used herein to denote any material that exhibits semiconducting properties including, for example, Si, SiGe, SiGeC, SiC, Ge alloys, GaAs, InAs, InP as well as other III/V or II/VI compound semiconductors. Preferably, the semiconductor material(s) of the substrate is a Si-containing semiconductor, with Si or SiGe being highly preferred.

The semiconductor substrate 12 may also include a first doped (n- or p-) region, and a second doped (n- or p-) region. For clarity, the doped regions are not specifically labeled in the drawings of the present application. The first doped region and the second doped region may be the same, or they may have different conductivities and/or doping concentrations. These doped regions are known as "wells".

After providing the semiconductor substrate 12, the isolation region 16 is formed into the substrate by utilizing a conventional technique well known in the art. For example, and when the isolation region 16 is a trench isolation region, a conventional trench isolation process can be employed. This includes, for example, forming a trench into the substrate by lithography and etching, optionally filling the trench with a trench liner such as, for example, TiN or TaN, and then filling the trench with a trench dielectric such as an oxide. The fill step may include a high-density plasma deposited oxide, or an oxide formed from an oxygen precursor such as TEOS. An optional densification step and/or a planarization step may follow the trench fill. When a field isolation region is used as the isolation region 16, a conventional local oxidation of silicon (LOCOS) process can be used in forming the same.

In FIG. 1A, isolation region 16 is a trench isolation region which extends down to the surface of the buried insulating layer 12B. Although such an embodiment is depicted and illustrated, the present invention also contemplates other depths for the isolation region 16. For example, the isolation region 16 may have a depth that is above the buried insulating layer 12B, within the buried insulating layer 12B, or within the lower semiconductor layer 12A of the semiconductor-on-insulator substrate.

As stated above, each of the FETs of different conductivity includes a gate dielectric 18. The gate dielectric 18 in the nFET region may be the same or different, preferably the same, as that in the pFET region. The gate dielectric 18 can be formed by a thermal growing process such as, for example, oxidation, nitridation or oxynitridation. Alternatively, the gate dielectric 18 can be formed by a deposition process such as, for example, chemical vapor deposition (CVD), plasma-assisted CVD, atomic layer deposition (ALD), evaporation, reactive sputtering, chemical solution deposition or other like deposition processes. The gate dielectric 18 may also be formed utilizing any combination of the above processes.

The gate dielectric 18 is comprised of an insulating material including, but not limited to: an oxide, nitride, oxynitride and/or silicate including metal silicates and nitrided metal silicates multi-layered gate dielectrics are also contemplated. In one embodiment, it is preferred that the gate dielectric 18 is comprised of an oxide such as, for example, $SiO_2$, $HfO_2$, $ZrO_2$, $Al_2O_3$, $TiO_2$, $La_2O_3$, $SrTiO_3$, $LaAlO_3$, and mixtures thereof.

The physical thickness of the gate dielectric 18 may vary, but typically, the gate dielectric 18 has a thickness from about 0.5 to about 10 nm, with a thickness from about 0.5 to about 3 nm being more typical.

After forming the gate dielectric 18, polysilicon or another gate conductor material or combination thereof, which becomes the gate conductor 20 shown in FIG. 1A, is formed on the gate dielectric 18 utilizing a known deposition process such as, for example, physical vapor deposition, CVD or evaporation. The gate conductor 20 may be doped or undoped. If doped, an in-situ doping deposition process may be employed in forming the same. Alternatively, a doped gate conductor 20 can be formed by deposition, ion implantation and annealing. The doping of the gate conductor 20 will shift the workfunction of the gate formed. Illustrative examples of dopant ions include As, P, B, Sb, Bi, In, Al, Ga, Tl or mixtures thereof. Typical doses for the ion implants are 1E14 ($=1 \times 10^{14}$) to 1E16 ($=1 \times 10^{16}$) atoms/cm$^2$ or more typically 1E15 to 5E15 atoms/cm$^2$. The thickness, i.e., height, of the gate conductor 20 deposited at this point of the present invention may vary depending on the deposition process employed. Typically, the gate conductor 20 has a vertical thickness from about 20 to about 180 nm, with a thickness from about 40 to about 150 nm being more typical.

The gate conductor 20 can comprise any conductive material that is typically employed as a gate electrode of a CMOS structure. Illustrative examples of such conductive materials that can be employed as the gate conductor 20 include, but are not limited to: polysilicon, metals or metal alloys, silicides, conductive nitrides, polySiGe and combinations thereof, including multilayers thereof. The gate conductor 20 in each device region (i.e., nFET and pFET) may comprise the same, or different, preferably, the same conductive material. In some embodiments, it is possible to form a barrier layer between multiple layers of gate conductors.

An optional dielectric cap (not shown) can be present atop the gate conductor 20 at this point of the present invention. The optional dielectric cap, which is typically comprised of an oxide or nitride, is typically removed before or immediately after the source/drain diffusion regions have been silicided.

An optional inner spacer 22 can be present on at least the sidewalls of each of the gate conductors 20. The optional inner spacer 22 is a passivation layer than can be formed by a thermal technique. Typically, the optional inner spacer 22 is an oxide, nitride or oxynitride, which has a thickness from about 5 to about 15 nm. When present, the optional inner spacer 22 is also typically present on the sidewalls of the gate dielectric 18 as well as an exposed surface of the semiconductor substrate 12.

Each FET also includes a wide outer spacer 24. The wide outer spacer 24 is comprised of an insulator such as an oxide, nitride, oxynitride and/or any combination thereof. Preferably, oxide inner spacers 22 are formed and nitride outer spacers 24 are formed. The wide outer spacer 24 is formed by deposition and etching.

The width of the outer spacer 24 must be sufficiently wide enough such that the source and drain silicide contacts (to be subsequently formed) do not encroach underneath the edges of each of the gate stacks. Also, the widths of the outer spacer 24 must be sufficiently wide enough so that the deep source/drain implants also do not encroach significantly into the channel region to cause short channel effects. Typically, the source/drain silicide does not encroach underneath the edges of the gate stack when the wide outer spacer 26 has a width, as measured at the bottom, of about 20 nm or greater.

Source/drain diffusion regions (not specifically shown) are typically present in the semiconductor substrate 12 at the footprint of each of the FETs. The source/drain diffusion regions are formed utilizing ion implantation and an annealing step. The annealing step serves to activate the dopants that were implanted by the previous implant step. The conditions for the ion implantation and annealing are well known to those skilled in the art. In the present invention, the phrase "source/drain diffusion regions" includes extension regions, halo regions and deep source/drain regions.

In some embodiments of the present invention and when the substrate does not include silicon, a Si-containing layer can be formed atop of the exposed portions of the substrate to provide a source for forming the silicide contacts. Illustrative examples of Si-containing materials that can be used include, for example, Si, single crystal Si, polycrystalline Si, SiGe, and amorphous Si. This embodiment of the present invention is not illustrated in the drawings.

Silicide contacts are formed after each FET region is formed utilizing a standard salicidation process well known in the art. This includes forming a metal capable of reacting with Si atop the entire structure, forming an oxygen barrier layer atop the metal, heating the structure to form a silicide, removing non-reacted metal and the oxygen barrier layer and, if needed, conducting a second heating step. The second heating step is required in those instances in which the first heating step does not form the lowest resistance phase of the silicide. In FIG. 1A, reference numeral 26 denotes the silicided contacts on the source/drain diffusion regions. Note that if the gate conductor 20 is comprised of polysilicon or SiGe, this step of the present invention can be used in forming a silicide contact atop the Si-containing gate conductor. In FIG. 1A, reference numeral 28 is used in defining the silicided contact located on the gate conductor 20.

Figure 1B:
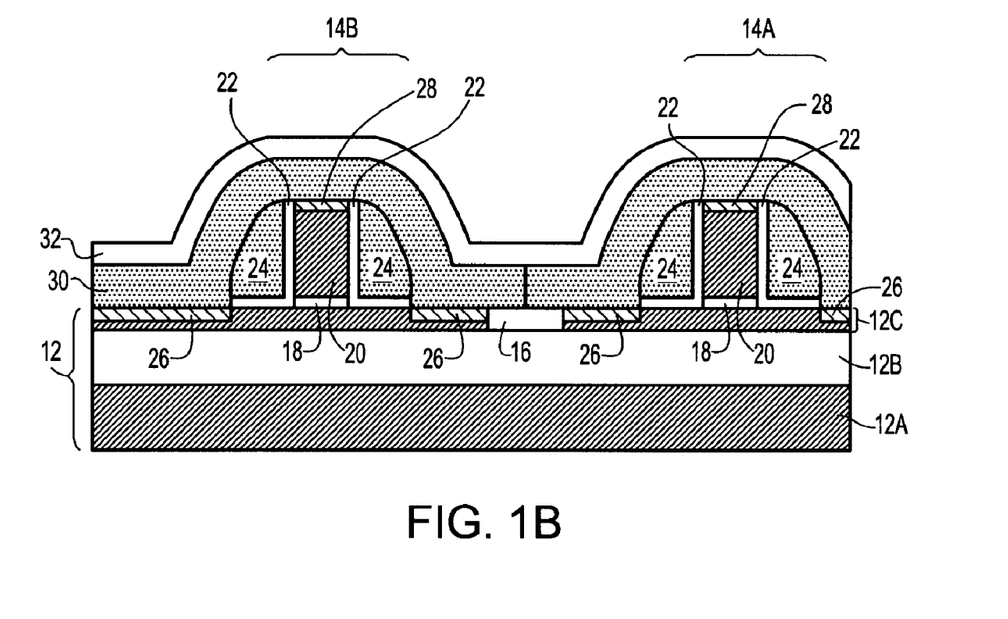

FIG. 1B illustrates the structure after forming a first stress inducing liner 30 and a hard mask 32. The first stress inducing liner 30 may be of a compressive stress or of a tensile stress. For the embodiment illustrated, the first stress inducing liner 30 is of tensile stress. The first stress inducing liner 30 may be any material that is capable of introducing a stress into the device channel. Examples of such stress inducing materials, include, but are not limited to: $Si_3N_4$, SiC, silicon oxynitride and other like materials. Typically, the first stress inducing liner 30 is comprised of $Si_3N_4$. The first stress inducing liner 30 can be formed utilizing various chemical vapor deposition (CVD) processes including, for example, low pressure CVD, plasma enhanced CVD, rapid thermal CVD, BTBAS-based ($C_8H_{22}N_2Si$ reacted with ammonia) CVD, where BTBAS is a modern metalorganic precursor for CVD applications. The stress type is controlled by modifying the precursor and deposition conditions. Such modification is well with the knowledge of a skilled artisan. The first stress inducing liner 30 has an as deposited thickness from about 20 to about 150 nm, with an as deposited thickness from about 30 to about 100 nm being more typical.

The hard mask 32 is then formed atop the first stress inducing liner 30 utilizing a conventional deposition process such as, for example, CVD, PECVD, chemical solution deposition and evaporation. The hard mask 32 is typically comprised of an oxide such as, for example $SiO_2$. Although oxide hard masks are typically employed, the present invention also contemplates utilizing oxynitride hard masks as well. The thickness of the hard mask 32 can vary depending on the type of material used as well as the deposition process that is employed in forming the same. Typically, the hard mask 32 has an as deposited thickness from about 5 to about 40 nm, with an as deposited thickness from about 10 to about 25 nm being even more typical.

Figure 1C:
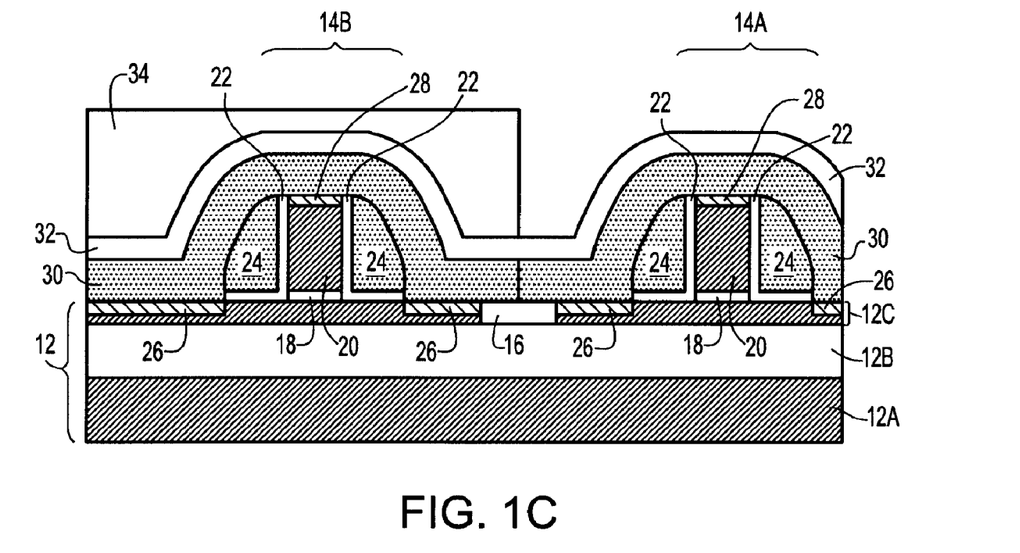

FIG. 1C shows the structure after forming a first patterned photoresist 34 which protects at least one of the FET device regions on the structure shown in FIG. 1B. In the particular embodiment shown, the first patterned photoresist 34 is located over the region including the nFET device. The first patterned photoresist 34 is formed by deposition (such as, for example, CVD, PECVD, and spin-on coating). and lithography. As is shown in FIG. 1C, the hard mask 32, which is located in the region including the pFET device, is not protected by the first patterned photoresist 34.

Figure 1D:
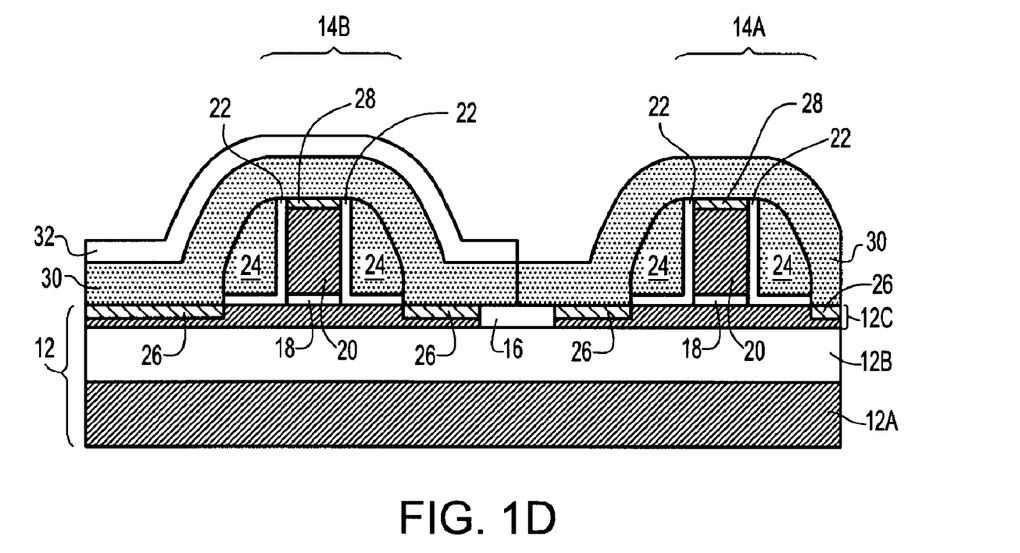

FIG. 1D shows the structure that is formed after removing the hard mask 32 from the region including the pFET device and stripping the first patterned photoresist 34 from atop the region including the nFET device. The exposed hard mask 32 located atop the pFET device is removed utilizing an etching process that selectively removes hard mask material, stopping atop the underlying first stress inducing liner 30. When the hard mask 32 is comprised of an oxide, $CF_4$ chemicals can be used to selectively remove the exposed hard mask 32 from atop the pFET device. The first patterned photoresist 34 is then stripped utilizing a conventional resist stripping process that is well known in the art.

Figure 1E:
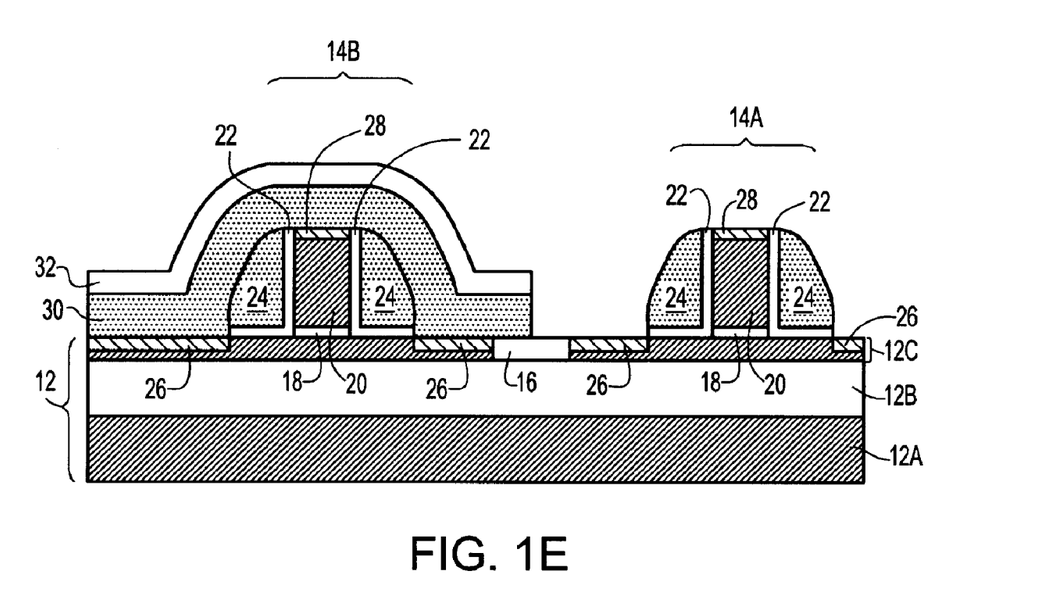

After forming the structure shown in FIG. 1D, the exposed first stress inducing liner 30 located atop the pFET device is then removed using the remaining oxide hard mask 32 present atop the nFET device as a patterned mask. The resultant structure is shown, for example, in FIG. 1E. The exposed stress inducing liner 30 is removed utilizing an etching process that selectively removes the stress inducing liner not protected by the hard mask 32 from the structure. When a nitride stress inducing liner is used and when an oxide hard mask is used, $CH_2F_2$, $CHF_3$, $CH_3F$, and $O_2$ chemicals can be used to selectively remove the exposed first stress inducing liner 30 from atop the region including the pFET device.

It is noted that during this step of the present invention, the silicide contact 26 located at least atop the source/drain diffusion regions is damaged; some damage may also take place within silicide contact 28 as well. By "damaged" it is meant that at least some part, particularly a surface region, of the silicide contact becomes amorphorized which increases the resistant of the contact from a first value to a second value that is greater than the first value. An increase resistance of about 20 to about 150% of the silicide contact can be obtained when the first stress inducing liner 30 is removed from the region including the pFET device (a similar value results when the first stress inducing liner is removed from the region including the nFET device).

Figure 1F:
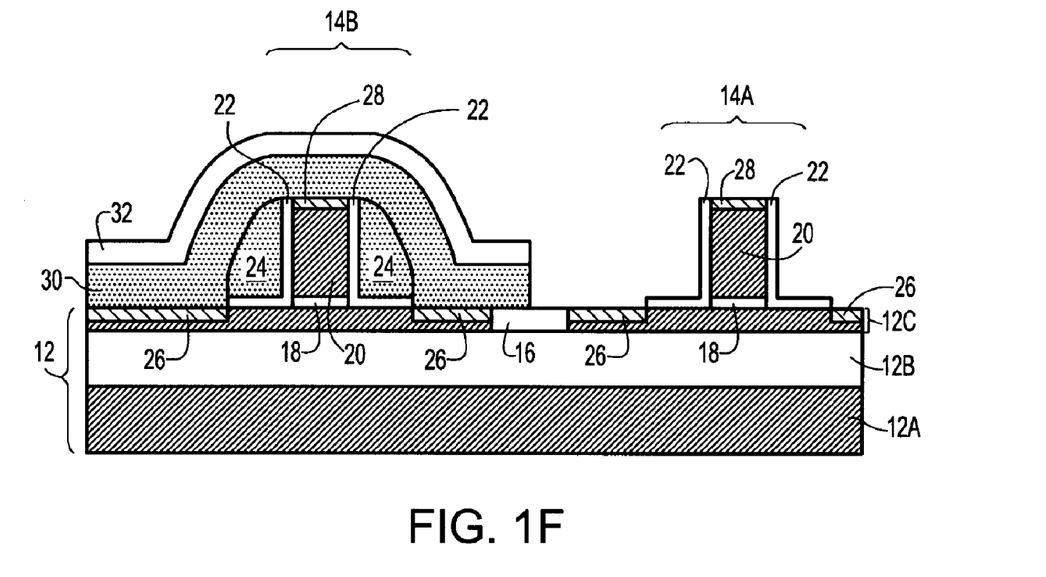
Figure 1G:
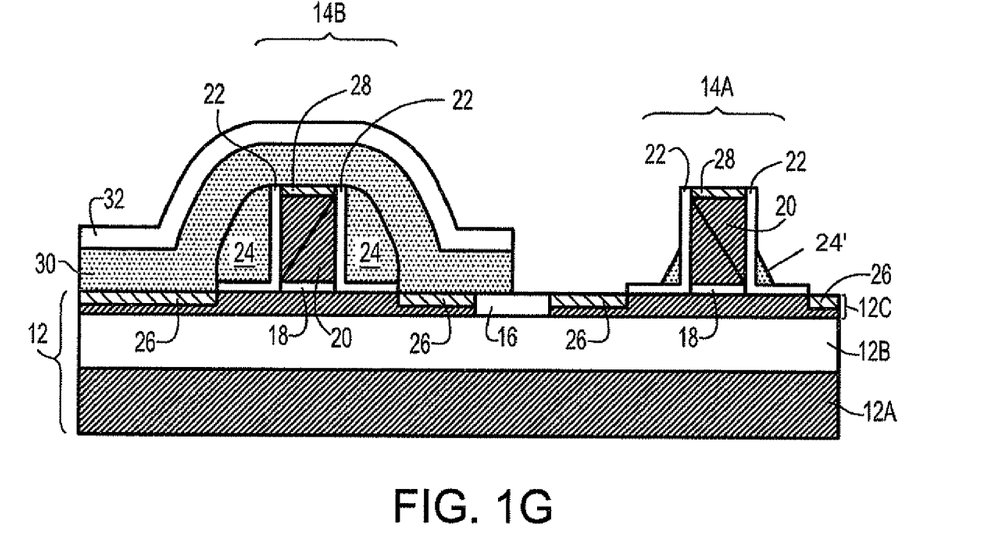

At this point of the present invention, the wide outer spacer 24 is completely removed from the region including the pFET device (See FIG. 1F) or partially removed from the region including the pFET device (See FIG. 1G). In the case when the wide outer spacer 24 is partially removed, the remaining outer spacer 24' has a width that is much less than the original width. Typically, the remaining outer spacer 24' has a width from about 5 to about 20 nm. The wide outer spacer 24 is completely or partially removed utilizing an etching step that is selective in removing the material of the outer spacer 24. A timed etching process can be used to partially remove the wide outer spacer 24. Typically, and when the outer spacer 24 is comprised of a nitride, $CH_2F_2$, $CHF_3$, $CH_3F$, or $O_2$ chemicals are used to completely or partially remove the outer spacer material.

It should be noted that during this step of the present invention as well more damage to the silicide contact atop at least the source/drain diffusion regions occurs. The complete or partial removal of the wide outer spacer 24 forms a "spacerless FET".

After forming the 'spacerless' pFET device region, an anneal process is performed to heal the damage caused by removing the first stress inducing liner 30 and the wide outer spacer 24 from the structure. In particular, the anneal is performed to recrystallize the amorphous portions of the silicide such that the recrystallized silicide 26' (See FIG. 1H; this drawing and the remaining drawings assume that the entire wide outer spacer 24 has been removed from the pFET) has a resistance that is within the resistance range prior to damaging the same. The anneal which causes the formation of a recrystallized silicide 26' is performed at a temperature of about 350° C. or greater, preferably about 550° C. or greater. The exact annealing temperature is dependent on the material of the silicide. For example, a 350° C. anneal can be used for NiSi, while a 700° C. anneal can be used for $CoSi_2$. The silicide recrystallization anneal may be performed utilizing a rapid thermal anneal, a furnace anneal, a laser anneal, a microwave anneal, or a spike anneal. The anneal is typically performed in an inert ambient such as, for example, He, Ar, $N_2$ or mixtures thereof. This anneal may also recrystallize the silicide contact atop the gate conductor 20. This recrystallized silicide is labeled as 28' in FIG. 1H.

Figure 1H:
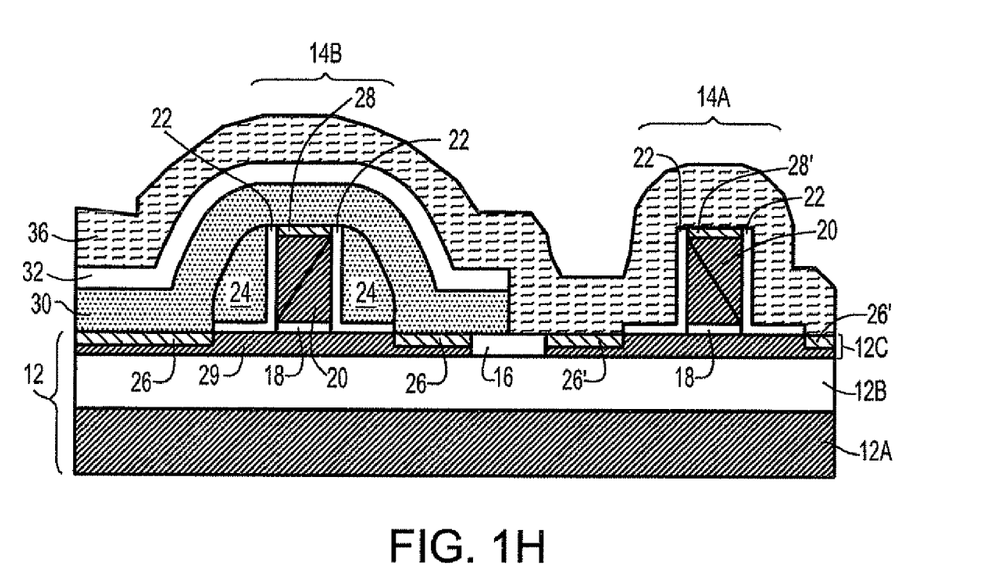

In addition to illustrating the recrystallized silicide 26', FIG. 1H also illustrates the structure after forming the second stress inducing liner 36 on the structure. The second stress inducing liner 36, which may comprise the same or different material as that of the first stress inducing liner 30, is of the opposite stress type as that of the first stress inducing liner 30. In the specific embodiment illustrated, the second stress inducing liner 36 is of compressive stress. The materials and deposition process used in forming the first stress inducing liner 30 can also be used in forming the second stress inducing liner 36. The second stress inducing liner 36 is typically comprised of $Si_3N_4$.

In FIG. 1H, the first stress inducing liner 30 present about the nFET device is of tensile stress, while the second stress inducing liner 36 present about the pFET is of compressive stress. It is noted that since a 'spacerless' pFET is used, the second stress inducing liner 36 is positioned closer to the device channel 29 than the first stress inducing liner 30 in the region including the nFET device. The device channel 29 is the area of the semiconductor that is beneath the gate conductor 20. A stronger strain enhancement is thus imparted on the pFET device channel because of the closer proximity of the second stress inducing liner 36 to the pFET device channel. By 'closer proximity' it is meant, that the second stress inducing liner 36 is located about 30 nm or less from the device channel 29.

Figure 1I:
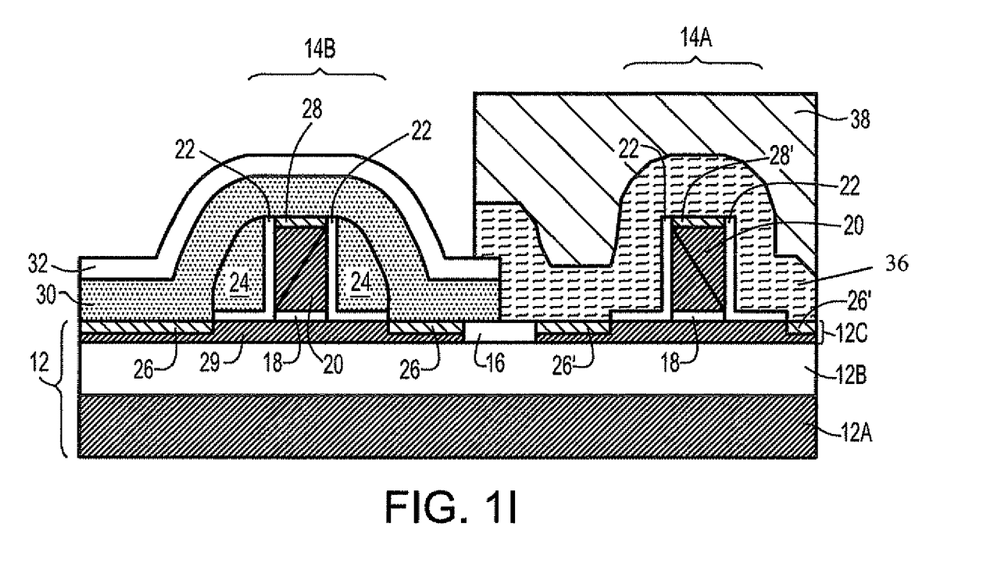

FIG. 1I shows the structure after selectively removing the second stress inducing liner 36 from the region including the nFET device. This selective removal is achieved by first providing a second patterned photoresist 38 atop the region including the pFET device and then etching the exposed second stress inducing liner 36, stopping atop the remaining hard mask 32.

Figure 1J:
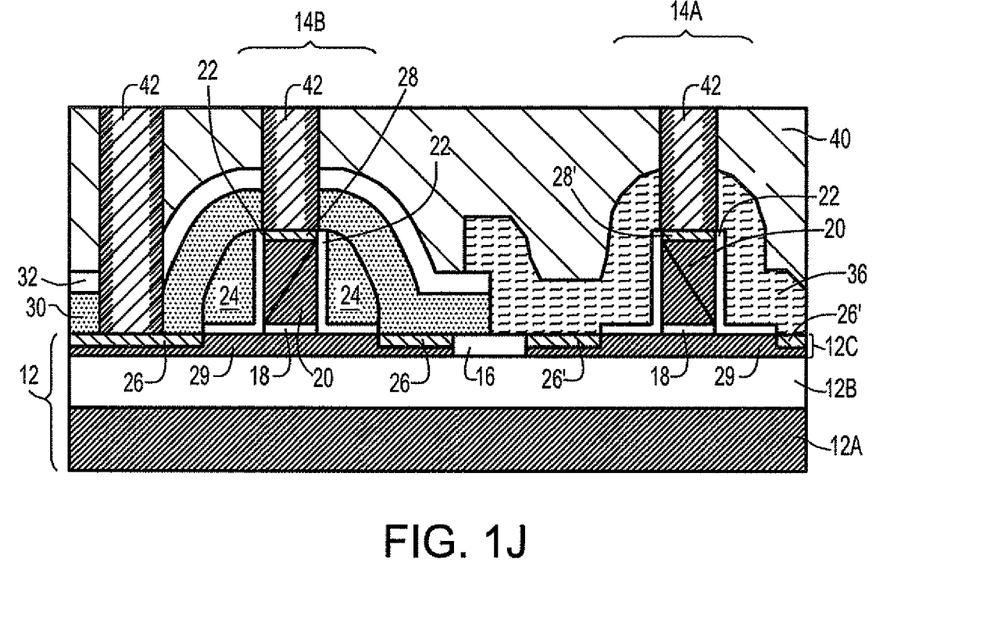

FIG. 1J shows the structure that is formed after forming an interconnect dielectric 40 having contact openings over the structure shown in FIG. 1I and then filling the contact openings with a conductive material 42. The interconnect dielectric 40 comprises any organic or inorganic dielectric that is used in interconnect technology. Typically, the interconnect dielectric 40 is comprised of $SiO_2$, an organosilicate glass, a poly(arylene) ether, a siloxane, a silsesquioxane or multilayers thereof. The interconnect dielectric is formed by a conventional deposition process such as, for example, CVD, PECVD, and spin-on coating, and the contact openings are formed by lithography and etching. The conductive material 42 may comprise a conductive metal, metal alloy, metal silicide, metal nitride or doped polysilicon. Sputtering, plating, evaporation, CVD, PECVD and other like deposition processes can be used in forming the conductive material 42. A planarization process may follow the conductive fill step.

In summary, the present invention provides a semiconductor structure and a method of fabricating the same in which strain enhancement is achieved for both nFET and pFET devices. In particular, the present invention provides at least one spacerless FET for stronger strain enhancement and defect reduction. The at least one spacerless FET can be a pFET, an nFET, or a combination thereof, with spacerless pFETs being particularly preferred since pFETs are generally fabricated to have a greater width than nFETs.

The wide spacer removal described above allows formation of an appropriate stress type liner to be located closer to the device channel then in cases where the wide spacers are still present. Under normal circumstances, the silicide is severely damaged in the prior art when the wide spacers are removed. To alleviate this damage and to return the resistance of the silicide back to nearly its original resistance value, an anneal is performed. Without this anneal, the devices would not be practical since the resistance of the silicide is above normal operating conditions. Also, the metal stringer issue is improved in the present invention due to increased spacing between the FETs.

It is noted that the present invention can be implemented without changing the normal implant schemes because the spacer is removed after the ions have been implanted and the silicide has been formed. Data has shown that improved device speed can be obtained using the inventive structure due to spacer elimination or reduction and the recrystallizing anneal process. Moreover, improved product yield can be achieved due to reduction of metal stringer defects.

While the present invention has been particularly shown and described with respect to preferred embodiments thereof, it will be understood by those skilled in the art that the foregoing and other changes in forms and details may be made without departing from the scope and spirit of the present invention. It is therefore intended that the present invention not be limited to the exact forms and details described and illustrated, but fall within the scope of the appended claims.

What is claimed is:

1. A method of fabricating a semiconductor structure comprising:

forming a first stress inducing liner and an overlaying hard mask on a structure including at least one nFET and at least one pFET, said first stress inducing liner having a first stress type and each FET including a device channel, a wide outer spacer and a silicided source/drain diffusion contact;

selectively removing said overlaying hard mask, said first stress inducing liner, and all or part of said wide outer spacer from one of said nFETs or pFETs to form at least one spacerless FET, while maintaining said wide outer spacer on the other of said nFETs or pFETs, wherein during removal of said first stress inducing liner and said wide spacer, said silicided source/drain diffusion contact of said at least one spacerless FIST is amorphized;

performing a recrystallization anneal in an inert ambient to recrystallize said amorphized silicided source/drain diffusion contact of said at least one spacerless FIST prior to formation of a second stress inducing liner; and selectively providing the second stress inducing liner of a second stress type that is different from said first stress type to said at least one spacerless FET including said recrystallized silicided source/drain diffusion contact, wherein said second stress inducing liner is positioned within 30 nm or less from the channel region of the at least one spacerless FET, wherein a portion of the second stress inducing liner and a portion of the first stress inducing linear overlap each other in an area atop an isolation region that is present in the semiconductor substrate.

2. The method of claim 1 wherein said spacerless PET is a pFET and said second stress inducing liner is of compressive strain.

3. The method of claim 1 wherein said spacerless PET is an nFET and said second stress inducing liner is of tensile strain.

4. The method of claim 1 wherein said recrystallization anneal is performed at a temperature of about 350° C. or greater in an inert ambient.

5. The method of claim 1 wherein said recrystallization anneal further crystallizes an upper gate conductor surface of said spacerless FET.

6. The method of claim 1 wherein said selectively removing includes etching using said hard mask as an etch stop mask.

7. The method of claim 1 wherein said structure is located on a semiconductor-on-insulator substrate or a bulk semiconductor substrate.

8. The method of claim 1 wherein said selectively providing comprises depositing said second stress inducing liner on said structure and etching said second stress inducing liner from said FET not including said first stress inducing liner.

9. The method of claim 1 further comprising forming an interconnect dielectric having conductively filled openings that extend down to at least some of said silicided source/drain diffusion contacts.

10. The method of claim 1 wherein said recrystallization anneal is selected from a rapid thermal anneal, a furnace anneal, a laser anneal, a microwave anneal and a spike anneal.

11. The method of claim 1 wherein said portion of the second stress inducing liner and said portion of the first stress inducing linear that overlap each other are separated by a portion of the hard mask.

12. The method of claim 1 wherein edges of the first and second stress introducing liners abut each other over said area atop an isolation region.

* * * * *